Oct. 30, 1962

G. E. THERIAULT 3,061,790

SIGNAL DETECTORS

Filed Feb. 16, 1960

INVENTOR.

GERALD E. THERIAULT

BY Eugene M. Whitacre

ATTORNEY 3,061,790
SIGNAL DETECTORS
Gerald E. Theriault, Haddon Heights, N.J., assignor to Radio Corporation of America, a corporation of Delaware
Filed Feb. 16, 1960, Ser. No. 9,014
7 Claims. (Cl. 329—150)

This invention relates to signal detectors, and more particularly to detectors of amplitude modulated carrier waves which are capable of highly satisfactory operation over a wide range of input levels extending down to appreciably weak signal levels.

In the detection of amplitude modulated (AM) carrier waves, it is often desired that the detection circuitry provide an output in a useful relatively undistorted form from under input signal level conditions ranging from extremely weak signals to extremely strong signals. Conventional AM detection circuitry, providing a satisfactory output at high signal levels, is usually characterized by poor performance at weak signal levels. At such low levels, the detecting device properties, normally relied upon at higher signal levels to effect substantially faithful reproduction of the desired modulation information, become unreliable and result in distorted reproduction. While a variety of forms of so-called weak signal detectors have been developed to assure faithful reproduction of modulation information derived from input signals in a weak signal range, such developed circuits are usually complex and/or expensive, and often are incapable of handling appreciably strong input signals.

The present invention is directed to AM detection circuitry which operates over an appreciably wide range of input levels, providing faithful reproduction of modulating information for both extremely weak input signals and extremely strong input signals. The wide range of satisfactory detector operation achieved in accordance with the present invention can be of the order of 8000:1, for example.

In accordance with the principles of the present invention, wide range detector operation is achieved with the use of oscillator circuitry which locks to the carrier frequency of the input signal and provides an output which effectively augments the carrier frequency energy of the signals applied to a detecting device. The carrier frequency energy augmentation thus achieved results in satisfactory reproduction of the desired modulation information in the detecting device output for weak input signal levels, at which levels such satisfactory reproduction would not be effected by the detecting device in the absence of the augmentation. For higher input signal levels, at which levels the detecting device would normally provide the desired form of reproduction without the need of the carrier frequency augmentation, such augmentation ceases, and the detecting device is driven conventionally.

In a particular working embodiment of the present invention, a tunnel diode is employed as a locked oscillator device for augmenting the carrier frequency energy of the AM signals applied to a detecting device. When properly loaded and biased, a tunnel diode provides a weak oscillator, which will lock to the frequency of an incoming carrier wave at a very low level (e.g. 30 microvolts). In accordance with the invention embodiment, the output of the tunnel diode locked oscillator in a range of low signal levels is employed to effectively exalt the carrier of the incoming wave. A detecting device responsive to the incoming waves as modified by the carrier exaltation provides substantially linear reproduction of the desired modulation information at such low input levels due to the carrier exaltation, whereas such substantially linear reproduction would not have been achieved by the detecting device in the absence of exaltation. For a higher range of input signal levels, the tunnel diode oscillations are effectively quenched, and the incoming modulated carrier waves appear at the detecting device in an essentially unmodified form. The input signal levels in this range, however, fall within the range of normal linear detection by the detecting device. The detecting device may take a variety of forms, such as a transistor or a biased or unbiased diode.

An object of the present invention is to provide an improved AM signal detector capable of satisfactory operation over a wide range of input levels.

A further object of the present invention is to provide an improved weak signal detector.

An additional object of the present invention is to provide an improved AM detection circuitry in which performance of a detecting device at weak signal levels is improved by use of a tunnel diode locked oscillator to augment the carried component of received modulated carrier waves.

Other objects and advantages of the present invention will be readily appreciated by those skilled in the art after a reading of the following detailed description and an inspection of the accompanying drawings in which FIGURE 1 illustrates schematically detection circuitry in accordance with an embodiment of the present invention;

Figure 1:
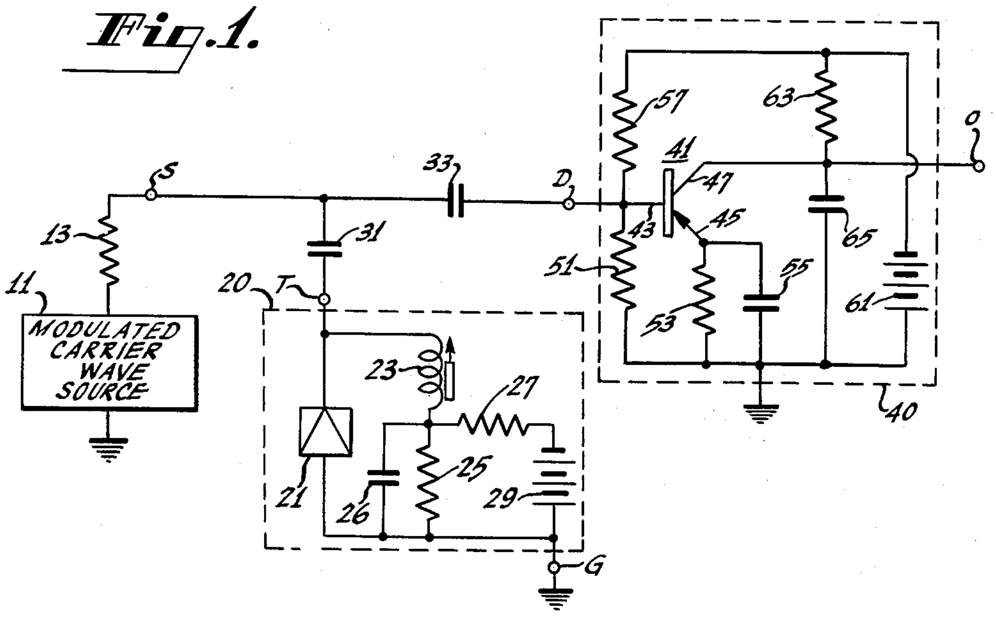

In FIGURE 1, a modulated carrier wave source 11 is shown coupled in series with a resistor 13 between a source output terminal S and a point of reference potential (illustratively, a point of ground potential). A tunnel diode oscillator 20 has a first terminal T, which is coupled by means of a coupling capacitor 31 to the source output terminal S, and a second terminal G, which is returned to ground. The oscillator 20 comprises a tunnel diode directly connected between terminals T and G, and shunted by the series combination of a tunable inductor 23 and a resistor 25. The resistor 25 in series with a resistor 27 is shunted across a bias voltage source, illustrated as a battery 29 having its positive terminal returned to the terminal G. A filter capacitor 26 shunted across resistor 25, bypasses the bias network at oscillator frequencies.

Figures 2, 3, 4:
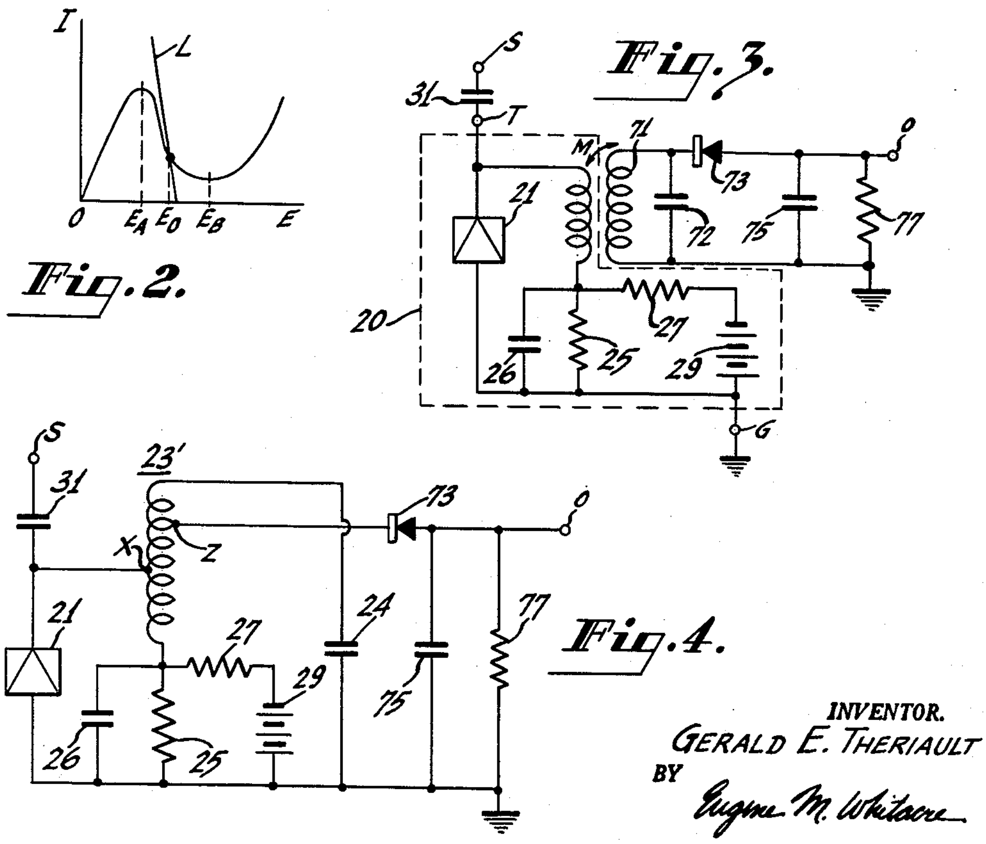
FIGURE 2 illustrates graphically the operating characteristic of a tunnel diode, to aid in explaining the operation of the embodiments of the present invention.
FIGURES 3 and 4 illustrate schematically modifications of the circuitry in FIGURE 1 in accordance with further embodiments of the present invention.

For an appreciation of the characteristics of a tunnel diode, its theorized mechanism of operation, and illustrations of its application to such circuitry as oscillators, reference may be made to an article entitled "Tunnel Diodes as High Frequency Devices," by H. S. Sommers, Jr., appearing in the July 1959 issue of the Proceedings of the I.R.E., at pages 1201 through 1206. The tunnel diode is a form of voltage controlled negative reistance device, exhibiting a negative resistance characteristic over a predetermined range of forward bias voltages. In FIGURE 2, a portion of the operating characteristic of a typical tunnel diode is illustrated graphically. It may be noted that for applied voltages of relatively small values, in the region from zero to $E_A$, the current through the tunnel diode increases as the voltage across the tunnel diode increases. Thus, in this first region of relatively small applied voltage values the tunnel diode exhibits a positive resistance. However, in the next succeeding region of applied voltage values from $E_A$ to $E_B$, a dip in the characteristic occurs. Over this intermediate region, the current through the diode decreases as the voltage applied across the diode increases. Thus, in this intermediate region, the tunnel diode exhibits a negative resistance. In the third region of applied voltage value, i.e. values above $E_B$, the current through the diode returns to a condition of increasing with increases in the voltage applied across the diode. Thus, in this third region, the tunnel diode again exhibits a positive resistance. Representative values for $E_A$ and $E_B$ are 50 and 350 millivolts, respectively.

It may be appreciated that, if the tunnel diode is stably biased in the negative resistance exhibiting region of its operating characteristic, association of suitable external circuitry with the tunnel diode will permit its use in sustaining the generations of oscillations. In the oscillator 20, it will be seen that resistors 25 and 27 form a voltage divider across the bias battery 29, the relative values of resistors 25 and 27 determining the magnitude of forward bias applied to the tunnel diode 21 via the inductor 23. The voltage dividing ratio is chosen to supply a bias voltage in the $E_A$ to $E_B$ range, e.g. the voltage value $E_0$, as shown in FIGURE 2. The absolute values of the divider resistances are chosen to insure that the net resistance presented by the biasing network across the tunnel diode is less in absolute value than the negative resistance exhibited by the tunnel diode at the selected bias, thus precluding the existence of multiple intersection between the biasing load line L and the diode's current versus voltage characteristic. It will be readily appreciated that this resistance relationship is a prerequisite for stable biasing in the negative resistance region.

To enable oscillations to be sustained by the tunnel diode 21, the external components associated with the tunnel diode, and presenting a load thereto, must be chosen to present a positive conductance which does not exceed the negative conductance exhibited by the diode at the operating point. Stated conversely, the positive resistance of the external load on the tunnel diode must be at least as great in absolute value as the negative resistance of the diode at the operating point. With this relationship established for oscillator 20 by suitable choice of the external component values, oscillations are sustained at a frequency determined primarily by the capacitance of the diode 21 and the inductance of the tuning inductor 23. Suitable tuning adjustment means, such as the illustrated tuning slug for inductor 23, are provided for adjusting the tuning of oscillator 20 to the frequency of the carrier component of the modulated carrier waves supplied by source 11. The injection of the modulated carrier waves from source 11 into oscillator 20, by means of the capacitor 31, causes the weak oscillator 20 to lock in frequency and phase with the carrier component of the modulated carrier waves. The locking of oscillator 20 is achieved in the circuit illustrated at input signal voltage levels as low as 30 microvolts, under input power conditions of as low as 10 micromicrowatts.

The source output terminal S is coupled by means of capacitor 23 to the input terminal D of detector 40. At low output levels of the source 11, the signals supplied to detector input terminal D via capacitor 33 comprise the modulated carrier wave output of source 11 with its carrier component augmented by the carrier frequency oscillatory output of the locked oscillator 20.

The detector 40 is illustratively shown as being the type employing a transistor as the detecting device. The base electrode 43 of a PNP transistor 41 is directly connected to the detector input terminal D. Forward bias is supplied to the base electrode 43 by means of a voltage divider comprising the series combination of resistors 57 and 51 shunted across a bias source (battery 61), with the base 43 connected to the junction of the resistors 57 and 51. Reverse bias is supplied to the collector 47 of transistor 41, by means of load resistor 63 connected between the negative terminal of bias source 61 and the collector 47. The emitter 45 of the transistor 41 is returned to the grounded terminal of the bias source 61 by means of a parallel RC time constant network, comprising resistor 53 shunted by capacitor 55. A carrier frequency bypass capacitor 65 is coupled between the collector 47 and the ground terminal. The detector output terminal O is directly connected to the collector 47.

The circuitry of detector 40 will be recognized as corresponding to a well-known form of transistor detector circuitry, which may satisfactorily serve to provide a substantially linear output for a relatively wide range of input signal levels (e.g. from 25 millivolts to 250 millivolts). However, for input signal levels below such a linear operating range, such a transistor detector would normally provide a distorted and relatively unuseable signal output. In accordance with the present invention, the range of input signal levels over which substantially linear output may be obtained from detector 40 is increased at the low end by virtue of the carrier exaltation effected by oscillator 20. The increased amplitude of the carrier component of the waves applied to detector input terminal B permits linear detection by detector 40 for an additional range of source output signal levels (e.g. from 30 microvolts to 25 millivolts).

At higher output levels of the signals from source 11, the need for carrier frequency augmentation at the applied signals disappears, since the signal levels are now in a range for which the detector 40 is capable of providing substantially linear detection operations unaided. The detector 40 circuit constants are therefore chosen so that, as the applied signals reach such higher levels, the detector loading on the tunnel diode increases significantly so as to oppose the sustaining of oscillations; i.e. the load impedance presented by the detector to the tunnel diode of oscillator 20 decreases significantly, altering the relationship between the external positive resistance and the diode's negative resistance required for maintenance of an oscillating condition. Thus, throughout a substantial portion of the range of source output signal levels for which the detector 40 will provide substantially linear detection unaided, the oscillator 20 is effectively inoperative.

It will be appreciated that the transistor detector circuitry 40 of FIGURE 1 is only exemplary of one form of detector which may be associated with the tunnel diode oscillator 20 in carrying out the principles of the present invention. FIGURE 3 illustrates a modification of the circuitry of FIGURE 1 in which a diode detector circuit is used in place of the transistor detector of FIGURE 1. FIGURE 3 also demonstrates a different manner of intercoupling the detector and the locked oscillator in the combination of the present invention. In FIGURE 3, a winding 71 is inductively coupled to the tuning inductor 23 of the oscillator 20. The winding 71 is tuned to the carrier frequency by the associated shunt capacitor 72. Shunted across the winding 71 is the series combination of a diode 73 and a parallel RC network comprising a detector load resistor 77 in shunt with a filter capacitor 75. One end of the load resistor 77 is returned to ground, and the output terminal O is directly connected to the opposite end of load resistor 77. The winding 71 is preferably provided with sufficient turns to provide a voltage step-up of the voltage appearing across the tuning inductor 23. With a sufficient voltage step-up ratio between windings 71 and 23, the usual forward biasing of the diode 73 may generally be omitted, as in the illustrated circuit. However, if such a voltage step-up is not convenient, or if the linear detection range requirements otherwise dictate, a source of suitable forward bias for the diode 73 may be inserted in the loop formed by the elements 71, 73 and 77.

In FIGURE 4, another modification of the circuitry of FIGURE 1 is illustrated, this modification also involving the use of a diode detector. In this embodiment of the invention, another manner of intercoupling the detector and oscillator is illustrated the mode of intercoupling employed in FIGURE 4 involving a slight modification of the oscillator circuitry.

In the circuit of FIGURE 4, the tuning inductor 23 of FIGURE 1 is replaced by an inductance element comprising a winding 23′ having a pair of intermediate taps X and Z. The lower end terminal of 23′ is returned to ground via a biasing network and filter capacitor in the same manner as the lower end terminal of tuning inductor 23 of FIGURE 1. The junction of tunnel diode 21 and coupling capacitor 31 is connected to the lower intermediate tap X on winding 23′. The cathode of the detector diode 73 is directly connected to the higher intermediate tap Z of winding 23′, and a capacitor 24 is coupled between the upper end terminal of winding 23′ and ground. The anode of diode 73 is directly connected to the output terminal O, and the detector load resistor 77, and its shunt filter capacitor 75, are connected between the diode anode and ground, as in FIGURE 2.

It will be noted that in the arrangement shown in FIGURE 4 the signal voltage applied across the diode detector (i.e. the signal voltage appearing between tap Z and ground) is a stepped up version of the signal voltage appearing across the tunnel diode 21 (i.e. the signal voltage appearing between tap X and ground). It will also be noted that the bias network 25, 27, 29, provided to bias the tunnel diode 21, also serves to supply forward bias to the detector diode 73. In the circuit of FIGURE 4, the resonant frequency of the tunnel diode oscillator is influence by the capacitor 24 as well as the inductance of winding 23′ and the capacitance exhibited by tunnel diode 21.

In operation, the diode detector embodiments of FIGURES 3 and 4 operate in accordance with the principles of the present invention in the same general manner as described previously with respect to the circuit arrangement of FIGURE 1. Thus, at low levels of the output of source 11, the carrier frequency energy of the windings applied to the diode detector 73 is augmented by the carrier frequency oscillations developed by the locked tunnel diode oscillator. At higher output levels, the tunnel diode oscillator ceases to oscillate, and linear detection is obtained from the diode detector unaided.

It may be observed that the detection apparatus in accordance with various described embodiments of the present invention effectively serves as a so-called synchronous detector or product detector for low level signals, and as a conventional envelope detector for high level signals.

The following list sets forth a set of values for the circuit constants of the embodiments of the invention illustrated in FIGURE 1, these values being given for purposes of example only:

| | | |
|---|---|---|
| Resistor 13 | ohms | 70 |
| Capacitor 31 | microfarad | .01 |
| Resistor 25 | ohms | 1 |
| Resistor 27 | ohms | 120 |
| Capacitor 33 | microfarads | .01 |
| Resistor 51 | ohms | 4700 |
| Resistor 53 | ohms | 50 |
| Capacitor 55 | microfarads | .01 |
| Resistor 57 | megohms | 1 |
| Resistor 63 | ohms | 2200 |
| Capacitor 65 | microfarads | .01 |
| Battery 29 | volts | 1.5 |
| Battery 61 | volts | 22.5 |
| Inductor 23 | microhenries | .15 |
| Carrier frequency | megacycles | 40 |

What is claimed is:

1. In a signaling system provided with a source of carrier frequency waves modulated in amplitude in accordance with intelligence, the combination comprising means for detecting the modulation of carrier frequency waves to produce an intelligence representative output signal, means for applying modulated carrier frequency waves from said source to said detecting means, and means operative over a first predetermined range of output levels for said carrier wave source and effectively inoperative over a second predetermined range of output levels for said carrier wave source for augmenting the carrier frequency energy of the modulated carrier frequency waves applied from said source to said detecting means.

2. Apparatus in accordance with claim 1 wherein said carrier frequency augmenting means comprises an oscillator coupled to said source and locked to the carrier frequency of said waves.

3. Apparatus in accordance with claim 2 wherein said oscillator comprises a tunnel diode, biasing means coupled to said tunnel diode for biasing said tunnel diode to a point on its operating characteristic at which said tunnel diode exhibits a negative resistance, and inductance means effectively shunting said tunnel diode for resonating with the capacitance of said diode at a frequency nominally equal to said carrier frequency.

4. Apparatus in accordance with claim 3 wherein said coupling of said oscillator to said source is effected by means of a capacitor, and wherein said capacitor also serves to couple said oscillator to said detecting means.

5. In a signaling system provided with a source of amplitude modulated carrier frequency waves, a wide range amplitude modulation detector comprising in combination a detecting device for detecting the amplitude modulation of modulated carrier waves applied thereto, said detecting device having substantially linear detecting properties for a restricted range of carrier wave input levels, means for applying modulated carrier frequency waves from said source to said detecting device, and means for causing substantially linear operation of said detecting device in response to carrier wave output levels of said source which fall below said restricted range, said last-named means comprising a tunnel diode oscillator nominally tuned to the carrier frequency of the waves from said source, means for causing said tunnel diode oscillator to lock to the carrier frequency of the output of said source, and means for applying the output of said tunnel diode oscillator to said detecting device in addition to the modulated carrier wave output of said source.

6. Apparatus in accordance with claim 5 wherein said tunnel diode oscillator is rendered substantially inoperative when the output signal level of said source corresponds to an input signal level within at least a portion of said restricted range.

7. In a modulated carrier wave receiving system, detection apparatus comprising the combination of a detecting device, a tunnel diode oscillator locked to the carrier frequency of the received waves, and means applying both said received waves and the output of said tunnel diode oscillator to said detecting device.

References Cited in the file of this patent

"The Crystal as a Generator and Amplifier," by Gabel; The Wireless World and Radio Review, Oct. 8, 1924, pp. 47 to 50.